US010079364B2

(12) United States Patent
Do et al.

(10) Patent No.: US 10,079,364 B2
(45) Date of Patent: Sep. 18, 2018

(54) DISPLAY DEVICE

(71) Applicant: SAMSUNG DISPLAY CO., LTD., Yongin-si, Gyeonggi-do (KR)

(72) Inventors: Yunseon Do, Yongin-si (KR); Jaejoong Kwon, Yongin-si (KR); Hyesog Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/252,121

(22) Filed: Aug. 30, 2016

(65) Prior Publication Data

US 2017/0133635 A1 May 11, 2017

(30) Foreign Application Priority Data

Nov. 5, 2015 (KR) .................. 10-2015-0155279

(51) Int. Cl.
*H01L 51/52* (2006.01)
*G02B 17/00* (2006.01)
*H01L 27/32* (2006.01)

(52) U.S. Cl.
CPC ........ *H01L 51/5271* (2013.01); *G02B 17/002* (2013.01); *H01L 27/3244* (2013.01); *H01L 51/524* (2013.01); *H01L 51/5253* (2013.01)

(58) Field of Classification Search
None
See application file for complete search history.

(56) References Cited

U.S. PATENT DOCUMENTS

| 9,391,128 | B2* | 7/2016 | Nomura | H01L 51/5092 |
| 2013/0300680 | A1* | 11/2013 | Kim | H01L 51/5281 345/173 |
| 2015/0115229 | A1 | 4/2015 | Jung | |
| 2015/0194443 | A1* | 7/2015 | Chen | H01L 29/78645 257/72 |

FOREIGN PATENT DOCUMENTS

| JP | 2014-142637 A | 8/2014 |
| KR | 10-2007-0121091 A | 12/2007 |
| KR | 10-2009-0069558 A | 7/2009 |
| KR | 10-2015-0047936 A | 5/2015 |

* cited by examiner

*Primary Examiner* — Ali Naraghi
(74) *Attorney, Agent, or Firm* — Lewis Roca Rothgerber Christie LLP

(57) ABSTRACT

A display device includes: a display panel including a display substrate having an active area and a non-active area outside the active area and a thin film encapsulation layer covering the display substrate; a printing film on the display panel and including a base film, a printing layer on one surface of the base film, and a plurality of reflectors arranged in a reflective area of the base film corresponding to the non-active area; a cover window on the printing film; and an adhesive layer between the printing film and the cover window.

20 Claims, 11 Drawing Sheets

DISPLAY DEVICE

CROSS-REFERENCE TO RELATED APPLICATION

This application claims priority to and the benefit of Korean Patent Application No. 10-2015-0155279, filed on Nov. 5, 2015 in the Korean Intellectual Property Office, the entire content of which is incorporated herein by reference.

BACKGROUND

1. Field

Aspects of one or more embodiments of the present invention relate to display devices.

2. Description of the Related Art

Generally, display apparatuses may be used in mobile devices such as smart phones, laptop computers, digital cameras, camcorders, personal digital assistants (PDAs), and tablet personal computers (tablets), or in electronic devices such as desktop computers, televisions, outdoor billboards, exhibition display devices, etc. Recently, slimmer display apparatuses have been released. Flexible display apparatuses have drawn attention as next generation display apparatuses since flexible display apparatuses are portable and may be applied to devices of various shapes. Among the flexible display devices, flexible display apparatuses based on organic light-emitting display techniques are some of the most attractive display devices.

SUMMARY

Aspects of one or more embodiments of the present invention relate to display devices that reduce light leakage. Additional aspects will be set forth in part in the description that follows and will be apparent in part from the description, or may be learned by practice of the presented embodiments.

According to an embodiment of the present invention, a display device is provided. The display device includes: a display panel including a display substrate having an active area and a non-active area outside the active area and a thin film encapsulation layer covering the display substrate; a printing film on the display panel and including a base film, a printing layer on one surface of the base film, and a plurality of reflectors arranged in a reflective area of the base film corresponding to the non-active area; a cover window on the printing film; and an adhesive layer between the printing film and the cover window.

The reflectors may include a plurality of grooves.

The reflectors may correspond to the printing layer and extend in a direction perpendicular to the display substrate.

The reflective area may cover the printing layer.

The printing layer may surround the active area.

The adhesive layer may cover the reflectors.

The reflectors may be randomly distributed in the reflective area corresponding to the printing layer.

The reflectors may be uniformly distributed in the reflective area corresponding to the printing layer.

A density of the reflectors may gradually reduce in a direction away from the active area.

The grooves may extend in a thickness direction of the base film.

The reflectors may be filled with one or more materials having smaller refractive indices than that of the adhesive layer.

The reflectors may include through-holes that pass through the base film.

The reflectors may have the same size.

A diameter of the reflectors may gradually reduce in a thickness direction of the base film.

The reflectors may have different sizes.

A diameter of the reflectors may gradually reduce in a thickness direction of the base film.

The reflectors may be filled with one or more materials having smaller refractive indices than that of the adhesive layer.

A refractive index of the reflective area may be less than that of the adhesive layer.

The base film may be one or more selected from polyimide (PI), polycarbonate (PC), polyethylene terephthalate (PET), polyethersulphone (PES), polyethylene naphthalate (PEN), polyarylate (PAR), and fiberglass reinforced plastic (FRP).

A diameter of the reflectors may be in a range from about 1 nanometer to about 100 micrometers.

BRIEF DESCRIPTION OF THE DRAWINGS

These and/or other aspects of the present invention will become more apparent and more readily appreciated from the following description of example embodiments, taken in conjunction with the accompanying drawings in which.

DETAILED DESCRIPTION

Figure 1:
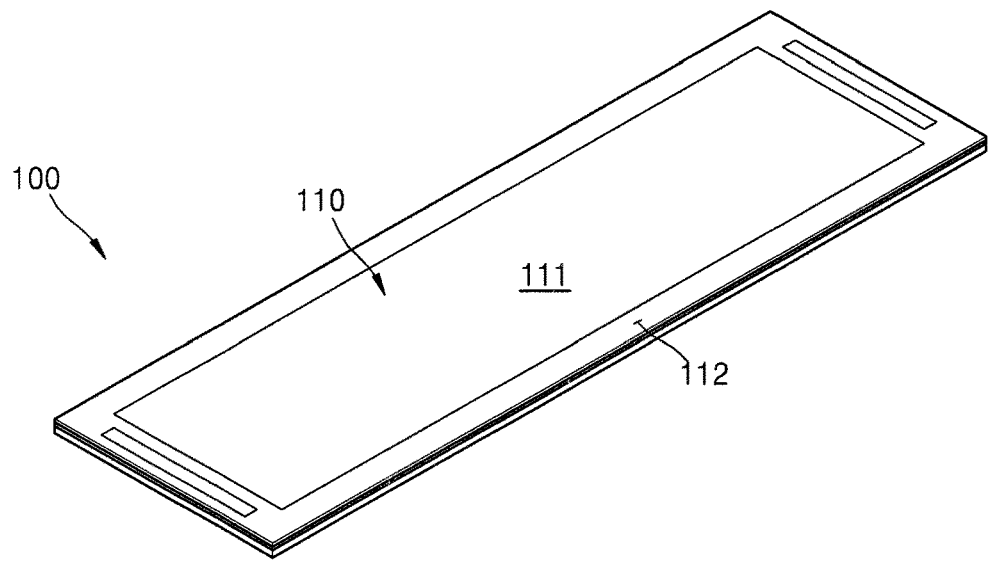
FIG. 1 is a perspective view of an example display device that is unrolled, according to an embodiment of the present invention.

As the present invention allows for various changes and numerous embodiments, example embodiments will be illustrated in the drawings and described in more detail in the written description. However, this is not intended to limit the present invention to particular modes of practice, and it is to be appreciated that all changes, equivalents, and substitutes that do not depart from the spirit and technical scope of the present invention are encompassed in the present invention. In the description of example embodiments of the present invention, detailed explanations of related art may be omitted when it is deemed that they may unnecessarily obscure the essence of the described embodiments. Expressions such as "at least one of," when preceding a list of elements, modify the entire list of elements and do not modify the individual elements of the list.

It will be understood that although the terms "first," "second," etc. may be used herein to describe various components, these components should not be limited by these terms. These components are used primarily to distinguish one component from another.

Meanwhile, the terminology used herein is for the primary purpose of describing example embodiments and is not intended to be limiting of the present invention. As used herein, the singular forms "a," "an," and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

It should be noted that while all physical structures occupy three dimensions, a linear or substantially linear structure (as would be apparent to one of ordinary skill), or two-dimensional cross-section extending in a linear or substantially linear direction or dimension, such as a wire, signal line, or hole, will be said to "extend" in a particular direction if that structure (or its defining structure) takes on its greatest measurement (or length or linearity) in that particular direction or dimension.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed. Reference will now be made in more detail to embodiments of a display device, by using the accompanying drawings, wherein the same elements are denoted by the same reference numerals, and a repeated explanation thereof may not be given.

Figure 2:
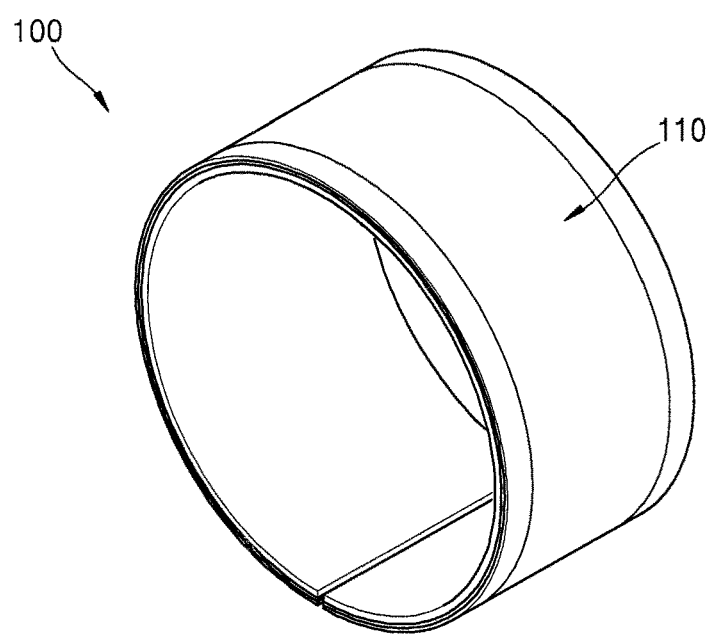
FIG. 2 is a perspective view of the display device of FIG. 1 that is rolled, according to an embodiment of the present invention.

FIG. 1 is a perspective view of an example display device 100 that is unrolled, according to an embodiment of the present invention. FIG. 2 is a perspective view of the display device 100 of FIG. 1 that is rolled, according to an embodiment of the present invention.

Referring to FIGS. 1 and 2, the display device 100 may include a flexible display panel 110. The flexible display panel 110 may include an active area (AA) 111 that displays images and an inactive area (IAA) 112 (or non-active area) outside the active area 111 and that does not display images. By way of example, the active area 111 may correspond to sub-pixels of the display panel 110, while the inactive area 112 may correspond to a perimeter area surrounding and not including the sub-pixels. The flexible display panel 110 may include various films or layers such as a display substrate, a touch screen, a polarization plate, etc. The display device 100 may be used to view images at various angles such as in an unrolled state, in a curved state, in a rolled state in which in the display device 100 has a cylindrical shape, etc.

Figure 3:
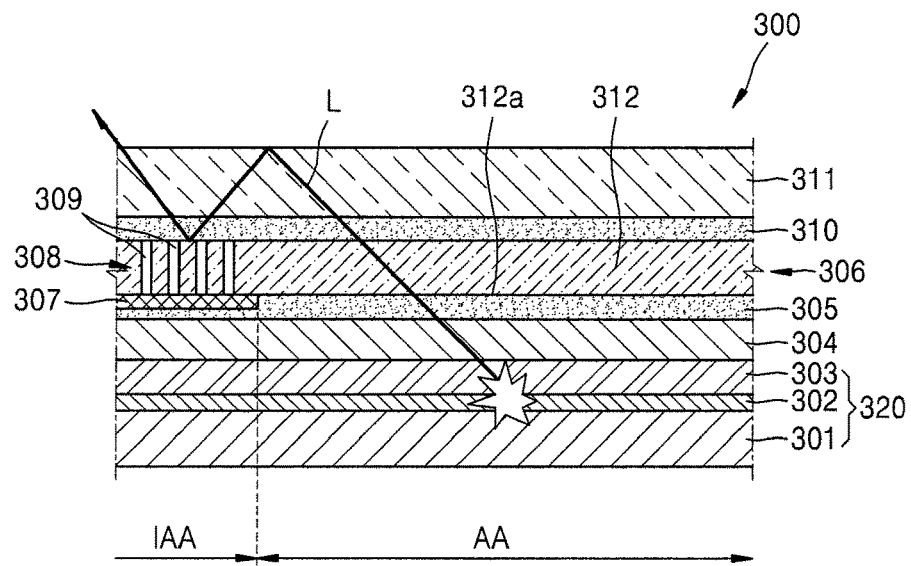
FIG. 3 is a cross-sectional view of a part of an example display device according to an embodiment of the present invention.
Figure 4:
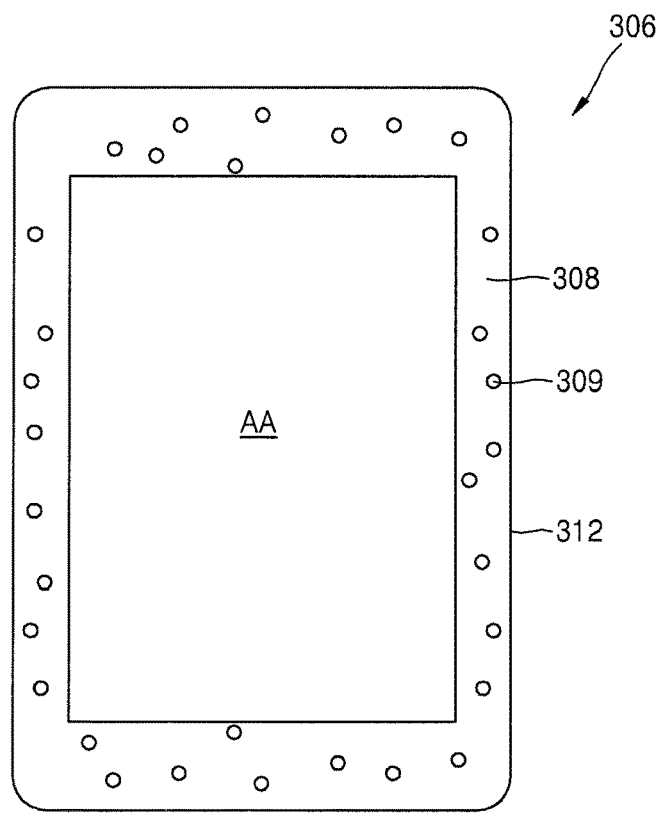
FIG. 4 is a plan view of an example printing film of FIG. 3 according to an embodiment of the present invention.

FIG. 3 is a cross-sectional view of a part of an example display device 300 according to an embodiment of the present invention. FIG. 4 is a plan view of an example printing film 306 of FIG. 3 according to an embodiment of the present invention.

For purposes of illustration and not limitation, the display device 300 is described as an organic light-emitting display device including a plurality of organic light emitting diodes (OLEDs), but the present invention is not limited thereto. In other embodiments, the display device 300 may be, for example, a liquid crystal display (LCD), a field emission display (FED), an electronic paper display (EPD), etc.

Referring to FIGS. 3 and 4, the display device 300 may include a display panel 320 for displaying images. The display panel 320 may include a display substrate 301 that displays images and a thin film encapsulation (TFE) 303 that covers the display substrate 301.

The display substrate 301 may include an active area AA that displays images and an inactive area IAA outside the active area AA. For example, in some embodiments, the inactive area IAA may surround the active area AA. A capping layer (CPL) 302 for protecting the OLEDs may be disposed between the display substrate 301 and the TFE 303.

A function film 304 may be disposed over the display panel 320. The function film 304 may include, for example, a touch screen or a polarization plate. In other embodiments, the function film 304 may be a film having a different function.

The printing film 306 may be disposed over the function film 304. The printing film 306 may be, for example, a decoration film that decorates an appearance of the display device 300. In some embodiments, the printing film 306 may act to reinforce light intensity of the display device 300 (e.g., reduce refractive index or light leakage).

A first adhesive layer 305 may be disposed between the function film 304 and the printing film 306. The first adhesive layer 305 may be an optical clear adhesive (OCA).

A cover window 311 may be disposed over the printing film 306. A second adhesive layer 310 may be disposed between the printing film 306 and the cover window 311. The second adhesive layer 310 may be an OCA.

In some embodiments, a reflective area 308 or layer that partially or totally reflects light on a light leakage path may be disposed, for example, in a perimeter portion of the printing film 306. Such a printing film 306 will now be described in more detail.

The printing film 306 may include a base film 312. The base film 312 may be, for example, one or more selected from polyimide (PI), polycarbonate (PC), polyethylene terephthalate (PET), polyethersulphone (PES), polyethylene naphthalate (PEN), polyarylate (PAR), and fiberglass reinforced plastic (FRP). A thickness of the base film 312 may be in a range from about 1 micrometer to about 1000 micrometers. Herein, terms of approximation such as "about" are to be interpreted in their ordinary sense as would be apparent to one of ordinary skill in the art.

A printing layer 307 may be disposed over the base film 312. For example, prior to adhering the printing film 306 to the function film 304 via the first adhesive layer 305, the printing layer 307 may be disposed over a perimeter portion of one side (e.g., the side that contacts the first adhesive layer 305) of a separately formed base film 312. The printing layer 307 may be disposed over one surface 312a of the base film 312 facing the display panel 320. For example, the printing layer 307 may be disposed over the printing film 306 by using a separate film. The printing layer 307 may be, for example, white or black. In another embodiment, the printing layer 307 may be directly printed on the printing film 306. The printing layer 307 may surround the active area AA and correspond to the inactive area IAA.

When the display panel 320 emits light, the light may be partially guided to the printing layer 307 (e.g., some of the emitted light may reflect within the display device 300 back to the printing layer 307). When the light arrives at the printing layer 307, the light may be scattered. For example, when the printing layer 307 is white, the light may be scattered. As a result, light leakage may occur in the inactive area IAA of the display panel 320.

To reduce or prevent light leakage, a plurality of reflectors 309 (e.g., openings, such as grooves or through-holes, and possibly filled or partially filled with one or more other materials) may be disposed in a reflective area 308 of the base film 312. The reflective area 308 may correspond to the inactive area IAA. The reflectors 309 may be disposed in a vertical direction of the display device 300 in correspondence to the printing layer 307 (e.g., the openings may extend in a direction perpendicular to the printing layer 307, display substrate 301, or thin film encapsulation layer). The reflective area 308, in which the reflectors 309 are disposed, may cover or correspond to the printing layer 307.

The reflectors 309 may include a plurality of grooves formed in the reflective area 308 (for example, extending into but not passing through the base film 312). In other embodiments, the reflectors 309 may be through-holes that pass through the base film 312. In still other embodiments, the reflectors 309 may be grooves having a set or predetermined depth in a thickness direction of the base film 312. The diameter of the reflectors 309 (for example, of each of the reflectors 309, or of most of the reflectors 309, or of almost all of the reflectors 309) may be in a range from about 1 nanometer to about 100 micrometers.

The second adhesive layer 310 may cover the reflectors 309. Refractive indices of the reflectors 309 may be less than the refractive index of the second adhesive layer 310. In more detail, the second adhesive layer 310 may have a relatively high refractive index compared to the reflectors 309.

For example, the refractive index of the second adhesive layer 310 including OCA may be 1.47. The refractive index of the base film 312 including PET may be 1.58. On the other hand, the refractive index of the reflective area 308, in which the reflectors 309 are arranged, may be less than 1.47. The refractive index of the reflective area 308 may be less than the refractive index of the second adhesive layer 310 or the base film 312 since the reflective area 308 includes the reflectors 309. This will be described in more detail later.

The reflectors 309 may have various density distributions in the reflective area 308. The reflectors 309 may be randomly distributed in the reflective area 308 corresponding to the printing layer 307. In other embodiments, the reflectors 309 may be uniformly distributed in the reflective area 308 corresponding to the printing layer 307. In still other embodiments, the reflectors 309 may be differently distributed within the reflective area 308 corresponding to the printing layer 307.

When the display panel 320 emits light L, the emitted light L may be partially guided (such as reflected within the layers of the display device 300) to the printing layer 307. For example, light in a light leakage path may be totally reflected at a boundary between the reflective area 308 (in which the reflectors 309 having relatively low refractive indices are arranged) and the second adhesive layer 310 having a relatively high refractive index. Accordingly, the light L does not reach the printing layer 307.

As described above, the reflective area 308, in which the reflectors 309 are arranged, may be disposed in light leakage paths, thereby reducing or minimizing light leakage of the display device 300.

Figure 5A:
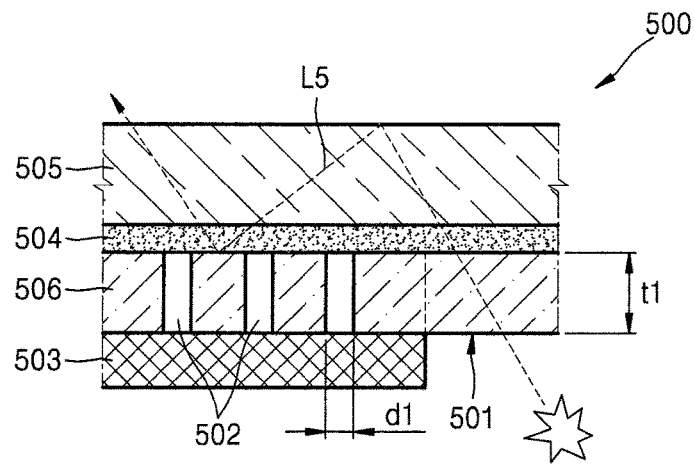
FIG. 5A is a cross-sectional view of a part of an example printing film according to an embodiment of the present invention.

FIG. 5A is a cross-sectional view of a part of an example printing film 500 according to an embodiment of the present invention.

Referring to FIG. 5A, the printing film 500 may include a base film 501 having a thickness t1 and a printing layer 503 disposed over one surface (such as a bottom surface) of the base film 501. A cover window 505 may be disposed over another surface (such as a top surface) of the base film 501. An adhesive layer 504 may be disposed between the base film 501 and the cover window 505.

A plurality of reflectors 502 may be disposed in a reflective area 506 of the base film 501 corresponding to the printing layer 503. The reflectors 502 may be through-holes that pass through the base film 501. The diameter d1 of the reflectors 502 may be in a range from about 1 nanometer to about 500 nanometers.

When the diameter d1 of the reflectors 502 is less than visible light wavelengths, light L5 may be totally reflected on a boundary between the adhesive layer 504 and the reflective area 506, in which the reflectors 502 are disposed. When the diameter d1 of the reflectors 502 is in the range from about 1 nanometer to about 500 nanometers, the effective refractive index $n_{\mathit{eff}}$ of the reflective area 506 of the base film 501 may be controlled by adjusting, for example, the size or density of the reflectors 502. When the effective refractive index $n_{\mathit{eff}}$ is controlled, the light leakage amount may be controlled. For example, the higher the density of the reflectors 502, or the smaller the diameter d1 of the reflectors 502, the lower the effective refractive index $n_{\mathit{eff}}$.

Figure 5B:
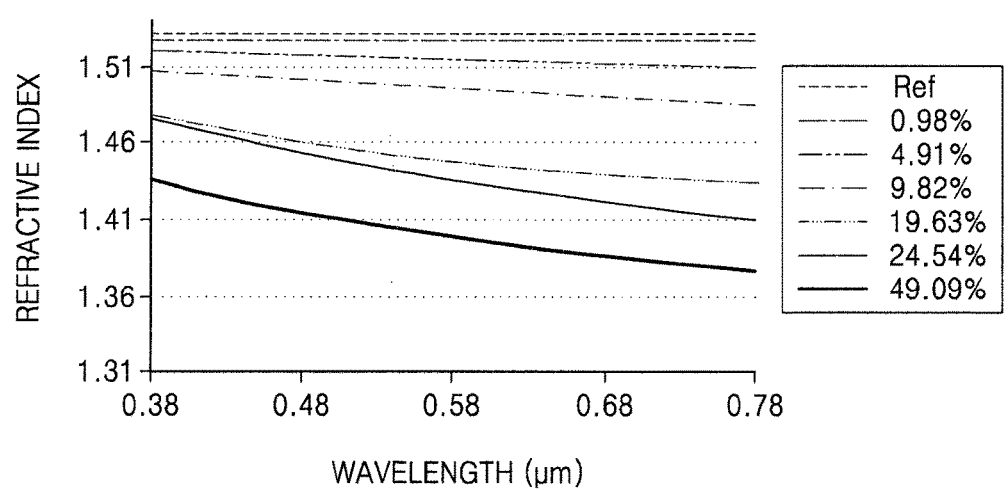
FIG. 5B is a graph comparing refractive indices of different example porosities of the printing film of FIG. 5A according to embodiments of the present invention and a comparable printing film.
Figure 5C:
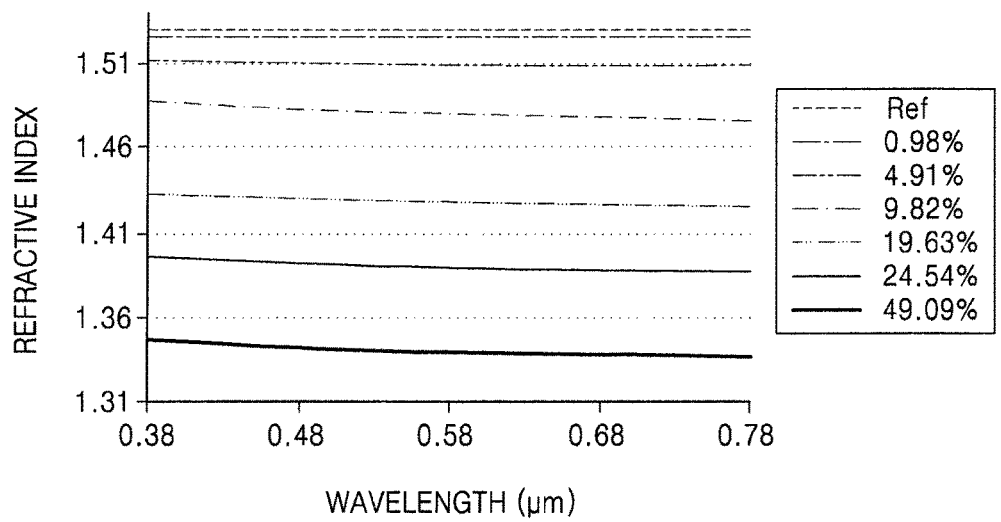
FIG. 5C is a graph of comparing refractive indices of different example porosities of the printing film of FIG. 5A according to other embodiments of the present invention and another comparable printing film.

FIG. 5B is a graph comparing refractive indices of different example porosities of the printing film 500 of FIG. 5A according to embodiments of the present invention and a comparable printing film. FIG. 5C is a graph comparing refractive indices of different example porosities of the printing film 500 of FIG. 5A according to other embodiments of the present invention and another comparable printing film. The diameter of the reflectors of FIG. 5B may be 100 nanometers (nm), and the diameter of the reflectors of FIG. 5C may be 20 nanometers.

Referring to FIGS. 5B and 5C, the refractive index of a comparable printing film Ref that has no reflectors is 1.58, whereas the refractive indices of the printing film 500 that has reflectors of different respective densities (and their corresponding porosities) may gradually reduce when the porosity of the printing film 500 gradually increases, e.g., from 0.98% to 4.91% to 9.82% to 19.63% to 24.54% to 49.09% (which are in proportion 1:5:10:20:25:50). For example, the 49.09% porosity may be obtained by arranging circular 100-nm through-holes in a uniform rectangular grid spaced apart by about 26.5 nm from each other (e.g., a 100-nm through-hole about every 126.5 nm in both the length and width directions to obtain a porosity of about 49.09%). Herein, terms of approximation such as "gradual" are to be interpreted as one of ordinary skill in the art would understand the terms in their ordinary usage.

In addition, for the same porosity, the refractive index of the printing film 500 may be further reduced by decreasing the diameter of the through-holes 502. For example, when the diameter of the reflectors is 20 nanometers (such as in the data of FIG. 5C), the corresponding refractive indices of the printing film 500 are lower when the diameter of the reflectors is 100 nanometers (such as in the data of FIG. 5B). In more detail, for the same porosity, the smaller the diameter of the reflectors, the lower the refractive index of the printing film 500.

Figure 6:
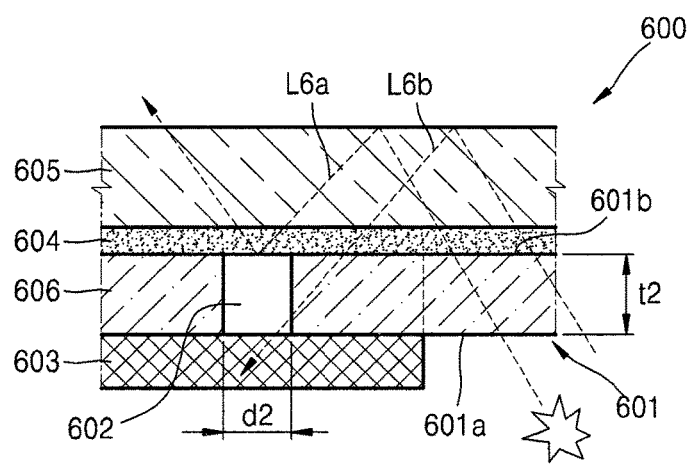
FIG. 6 is a cross-sectional view of a part of a printing film according to another embodiment of the present invention.

FIG. 6 is a cross-sectional view of a part of an example printing film 600 according to another embodiment of the present invention.

Referring to FIG. 6, the printing film 600 may include a base film 601 having a thickness t2 and a printing layer 603 disposed over a first surface 601a (such as a bottom surface) of the base film 601. A cover window 605 may be disposed over a second surface 601b (such as a top surface) of the base film 601. An adhesive layer 604 may be disposed between the base film 601 and the cover window 605.

A plurality of reflectors 602 may be disposed in a reflective area 606 of the base film 601 corresponding to the printing layer 603. The reflectors 602 may be through-holes that pass through the base film 601. Sizes of the reflectors 602 of FIG. 6 may be greater than sizes of the reflectors 502 of FIG. 5A. In more detail, the diameter of the reflectors 602 may be in a range from about 500 nanometers to about 100 micrometers.

When the diameter of the reflectors 602 is greater than visible light wavelengths, part of the emitted light (such as reflected light L6a) may be totally reflected on a boundary between the adhesive layer 604 and the reflective area 606, in which the reflectors 602 are disposed, whereas another part of the emitted light (such as unreflected light L6b) on a light leakage path may not pass through the reflectors 602 and may be scattered after reaching the printing layer 603.

Accordingly, a low refractive layer may be formed in a part of the base film 601 (such as a perimeter portion), thereby reducing a light leakage average value of an entire area of the printing layer 603. Thus, the printing film 600 including the reflectors 602 may reduce a light leakage amount compared to a comparable printing film that has no low refractive layer.

Figure 7A:
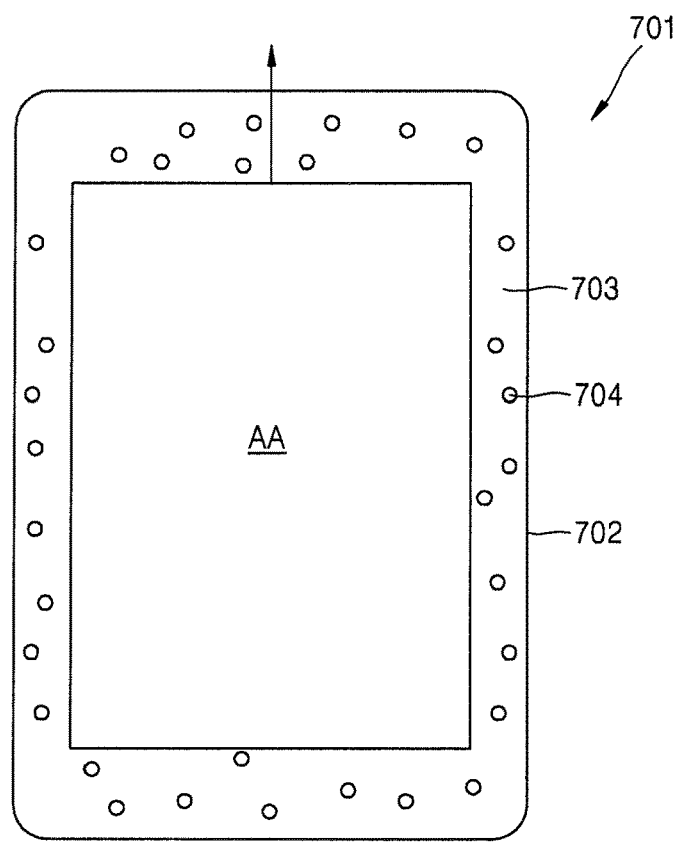
FIG. 7A is a plan view of patterns of a plurality of reflectors of an example printing film according to an embodiment of the present invention.

FIG. 7A is a plan view of patterns of a plurality of reflectors 704 of an example printing film 701 according to an embodiment of the present invention.

Referring to FIG. 7A, the printing film 701 may include a base film 702. The reflectors 704 may be disposed in a reflective area 703 of the base film 702. The reflectors 704 may be uniformly distributed in the reflective area 703 corresponding to a printing layer (see, for example, printing layer 307 of FIG. 3). The reflectors 704 may have a uniform density distribution. The printing film 701 may generally reduce light leakage and improve visibility when compared to a comparable printing film not having the reflectors.

Figure 7B:
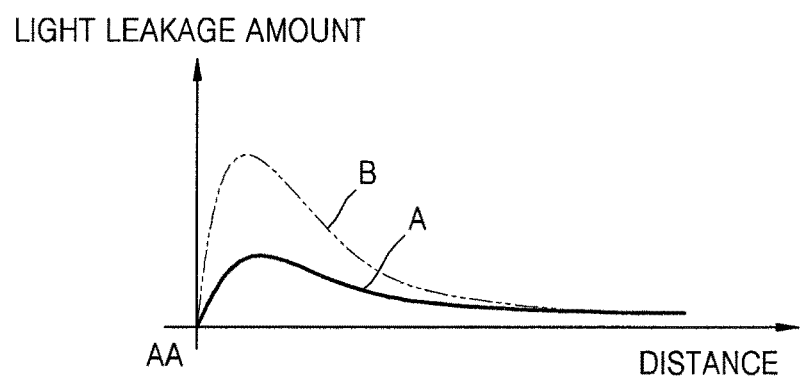
FIG. 7B is a graph of light leakage amount as a function of distance from an active area of the printing film of FIG. 7A according to an embodiment of the present invention and a comparable printing film.

FIG. 7B is a graph of light leakage amount as a function of distance from the active area of the printing film 701 of FIG. 7A according to an embodiment of the present invention and a comparable printing film (having no reflectors).

Referring to FIG. 7B, the printing film 701 (curve A) with reflectors 704 may reduce a light leakage amount compared to a comparable printing film (curve B) that has no reflectors. In some embodiments, the difference in light leakage amounts between the printing film 701 and the comparable printing film may diminish as the distance from the active area AA increases.

Figure 8A:
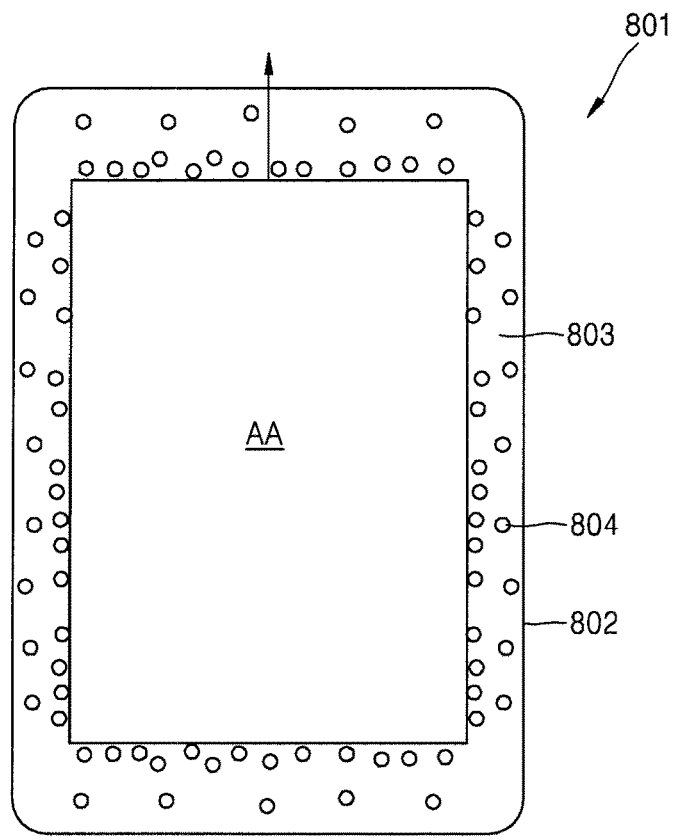
FIG. 8A is a plan view of patterns of a plurality of reflectors of an example printing film according to another embodiment of the present invention.

FIG. 8A is a plan view of patterns of a plurality of reflectors 804 of an example printing film 801 according to another embodiment of the present invention.

Referring to FIG. 8A, the printing film 801 may include a base film 802. The reflectors 804 may be disposed in a reflective area 803 of the base film 802. The reflectors 804 may be differently distributed in the reflective area 803 corresponding to a printing layer (see, e.g., printing layer 307 of FIG. 3). For example, the reflectors 804 may be arranged less densely farther away from the active area AA as indicated by the arrow in FIG. 8A. The density of the distribution of the reflectors 804 may be the highest in an adjacent area of (e.g., close to) the active area AA. For example, the density of the reflectors 804 may gradually reduce in a direction away from the active area AA. Such a printing film 801 may obtain the same light leakage amount throughout an entire area of the printing layer (as shown in FIG. 8B), which may decrease light leakage as seen by users.

Figure 8B:
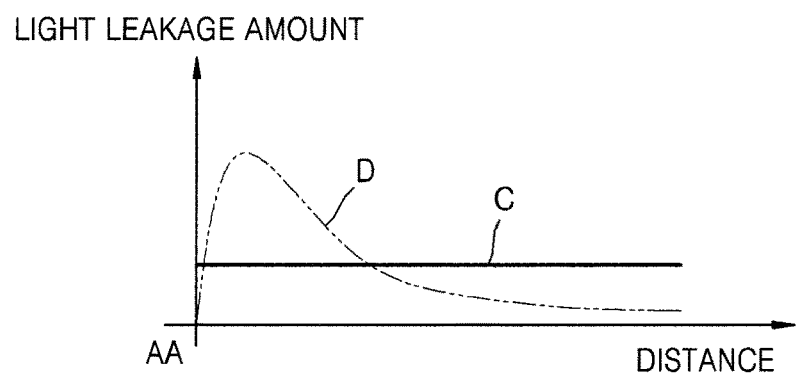
FIG. 8B is a graph of light leakage amount as a function of distance from an active area of the printing film of FIG. 8A according to an embodiment of the present invention and another comparable printing film.

FIG. 8B is a graph of light leakage amount as a function of distance from the active area AA of the printing film 801 of FIG. 8A according to an embodiment of the present invention and another comparable printing film.

Referring to FIG. 8B, the printing film 801 (curve C) may have reduced light leakage amount in an adjacent area of the active area AA, compared to a comparable printing film (curve D) that has no reflectors.

FIGS. 9A through 15 illustrate various patterns of reflectors of example printing films according to embodiments of the present invention.

Figure 9A:
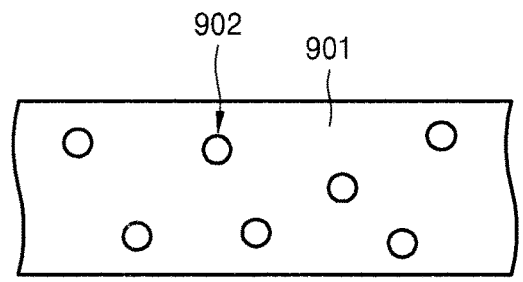
FIGS. 9A through 15 illustrate various patterns of reflectors of example printing films according to embodiments of the present invention.
Figure 9B:
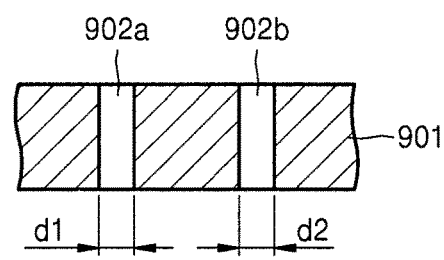

Referring to FIGS. 9A and 9B, a plurality of reflectors 902 may be disposed in base film 901 for a printing film. The reflectors 902 may be through-holes that pass through the base film 901. The diameter d1 of a first reflector 902a and the diameter d2 of a second reflector 902b adjacent to the first reflector 902a may have the same size.

Figure 10A:
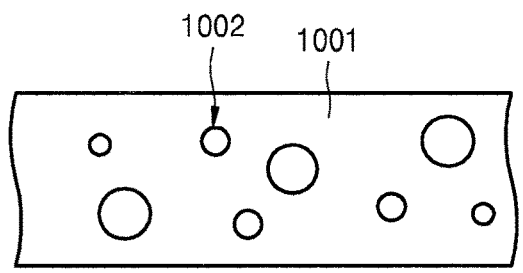
Figure 10B:
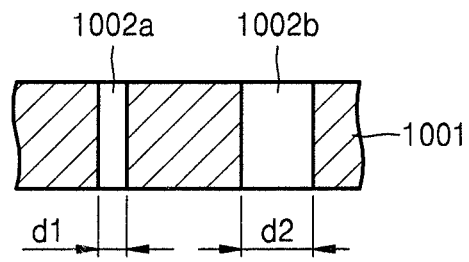

Referring to FIGS. 10A and 10B, a plurality of reflectors 1002 may be disposed in base film 1001 for a printing film. The reflectors 1002 may be through-holes that pass through the base film 1001. The diameter d1 of a first reflector 1002a and the diameter d2 of a second reflector 1002b adjacent to the first reflector 1002a may have different sizes.

Figure 11A:
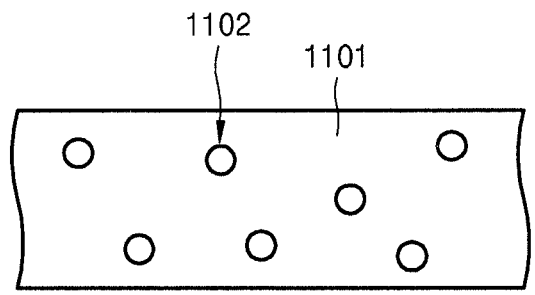
Figure 11B:
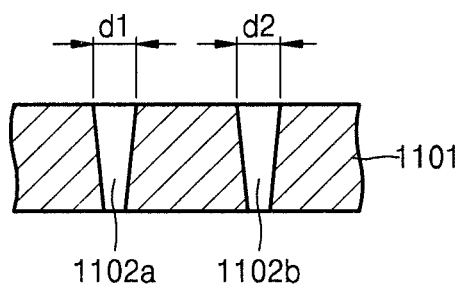

Referring to FIGS. 11A and 11B, a plurality of reflectors 1102 may be disposed in base film 1101 for a printing film. The reflectors 1102 may be through-holes that pass through the base film 1101. The diameter of the reflectors 1102 may gradually reduce in a thickness direction of the base film 1101. In more detail, the diameter of the reflectors 1102 may be reduced closer to the printing layer (see, e.g., printing layer 307 of FIG. 3) from the adhesive layer (see, e.g., second adhesive layer 310 of FIG. 3). The diameter d1 of a first reflector 1102a and the diameter d2 of a second reflector 1102b adjacent to the first reflector 1102a may have the same size at one surface (such as a top surface) of the base film 1101, and may taper uniformly to a smaller same size diameter at the other surface (such as the bottom surface) of the base film 1101.

Figure 12A:
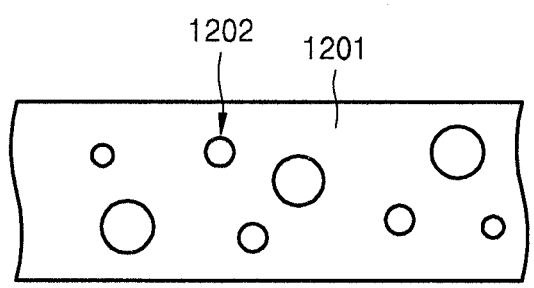
Figure 12B:
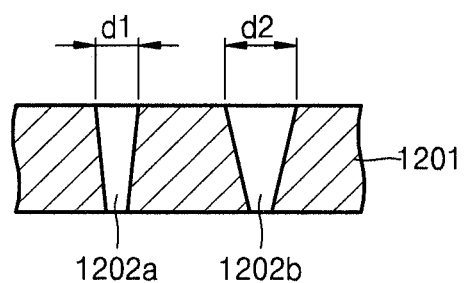

Referring to FIGS. 12A and 12B, a plurality of reflectors 1202 may be disposed in base film 1201 for a printing film. The reflectors 1202 may be through-holes that pass through the base film 1201. The diameter of the reflectors 1202 may gradually reduce in a thickness direction of the base film

1201. Unlike the reflectors 1102 of FIG. 11A, the reflectors 1202 may have different sizes. The diameter d1 of a first reflector 1202a and the diameter d2 of a second reflector 1202b adjacent to the first reflector 1202a may have different sizes at one surface (such as a top surface) of the base film 1201, and may taper (for example, taper uniformly) to smaller different size diameters at the other surface (such as the bottom surface) of the base film 1201.

Figure 13:
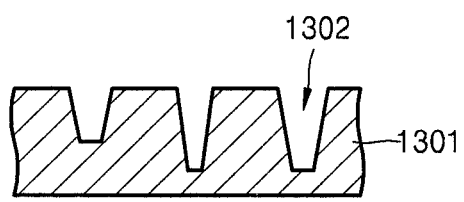

Referring to FIG. 13, a plurality of reflectors 1302 may be disposed in base film 1301 for a printing film. The reflectors 1302 may be grooves having a set or predetermined depth in a thickness direction of the base film 1301. The reflectors 1302 may not pass through the base film 1301. The reflectors 1302 may be sunken by a set or predetermined depth from one surface (for example, a top surface) of the base film 1301 facing the adhesive layer (see, e.g., second adhesive layer 310 of FIG. 3).

Figure 14:
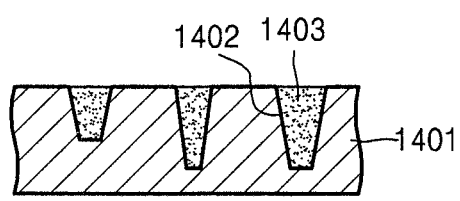

Referring to FIG. 14, a plurality of reflectors 1402 may be disposed in base film 1401 for a printing film. The reflectors 1402 may be grooves having a set or predetermined depth in a thickness direction of the base film 1401. Unlike the reflectors 1302 of FIG. 13, one or more materials 1403 having smaller refractive indices than that of the adhesive layer (see, e.g., second, adhesive layer 310 of FIG. 3) may be filled in the reflectors 1402.

Figure 15:
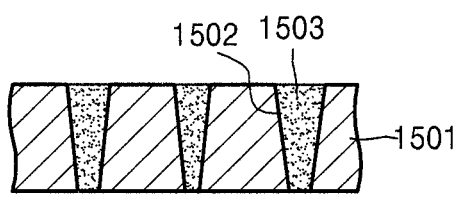

Referring to FIG. 15, a plurality of reflectors 1502 may be disposed in base film 1501 for a printing film. Unlike the reflectors 1402 of FIG. 14, the reflectors 1502 may be through-holes that pass through the base film 1501 (for example, any of the through-holes described above with reference to FIGS. 9A-12B). One or more materials 1503 having smaller refractive indices than that of the adhesive layer (see, e.g., second adhesive layer 310 of FIG. 3) may be filled in the reflectors 1502.

Figure 16:
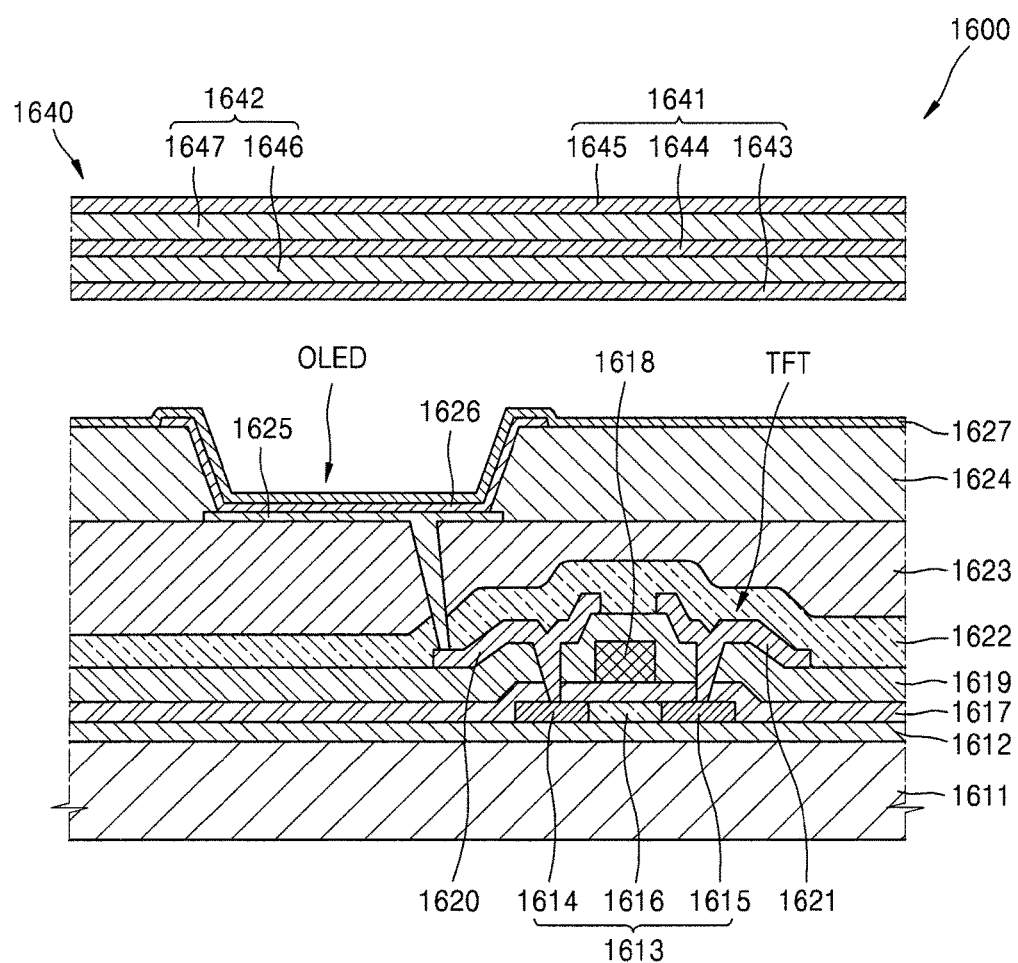
FIG. 16 is a cross-sectional view of a sub pixel of a part of an example organic light emitting display panel according to an embodiment of the present invention.

FIG. 16 is a cross-sectional view of a sub-pixel of a part of an example organic light-emitting display panel 1600 according to an embodiment of the present invention.

For example, sub-pixels of the organic light emitting display panel 1600 may each include one thin film transistor (TFT) and an organic light-emitting device, such as an organic light emitting diode (OLED). The TFT is not necessarily limited to a structure of FIG. 16, and numbers and structures of TFTs may vary in different embodiments.

Referring to FIG. 16, the organic light-emitting display panel 1600 may include a display substrate 1611 and a thin film encapsulation layer or portion 1640 over the display substrate 1611. The display substrate 1611 may be, for example, a flexible glass substrate or a flexible polymer substrate. In another embodiment, the display substrate 1611 may be a rigid glass substrate. The display substrate 1611 may be transparent, translucent, or non-transparent.

A barrier layer 1612 may be disposed over the display substrate 1611. The barrier layer 1612 may include an inorganic material or an organic material. The barrier layer 1612 may have a single layer structure or a multiple layer structure.

The TFT may be disposed over the barrier layer 1612. A semiconductor active layer 1613 may be disposed over the barrier layer 1612.

The semiconductor active layer 1613 may include a source area 1614 and a drain area 1615 that are doped with n-type impurity ions or p-type impurity ions. An area between the source area 1614 and the drain area 1615 may be a channel area 1616 that is not doped with impurities. The semiconductor active layer 1613 may include, for example, an organic semiconductor, an inorganic semiconductor, or amorphous silicon. The semiconductor active layer 1613 may include an oxide semiconductor.

A gate insulating layer 1617 may be disposed over the semiconductor active layer 1613. The gate insulating layer 1617 may include an inorganic layer. The gate insulating layer 1617 may have a single layer structure or a multiple layer structure.

A gate electrode 1618 may be disposed over the gate insulating layer 1617. The gate electrode 1618 may include a metal material having excellent conductivity. The gate electrode 1618 may have a single layer structure or a multiple layer structure.

An interlayer insulating layer 1619 may be disposed over the gate electrode 1618. The interlayer insulating layer 1619 may include an inorganic layer or an organic layer.

A source electrode 1620 and a drain electrode 1621 may be arranged over the interlayer insulating layer 1619. In more detail, contact holes may be formed by partially removing the gate insulating layer 1617 and the interlayer insulating layer 1619. The source electrode 1620 may be electrically connected to the source area 1614 and the drain electrode 1621 may be electrically connected to the drain area 1615 via the contact holes.

A passivation layer 1622 may be disposed over the source electrode 1620 and the drain electrode 1621. The passivation layer 1622 may include an inorganic layer or an organic layer. A planarization layer 1623 may be disposed over the passivation layer 1622. The planarization layer 1623 may include an organic layer. Any one of the passivation layer 1622 and the planarization layer 1623 may be omitted in some embodiments.

The TFT may be electrically connected to the OLED. The OLED may be disposed over the planarization layer 1623. The OLED may include a first electrode 1625, an intermediate layer 1626, and a second electrode 1627.

The first electrode 1625 may function as an anode and may include various conductive materials. The first electrode 1625 may include a transparent electrode or a reflective electrode. When the first electrode 1625 is a transparent electrode, the first electrode 1625 may include a transparent conductive layer. When the first electrode 1625 is a reflective electrode, the first electrode 1625 may include a reflective layer and a transparent conductive layer over the reflective layer.

A pixel-defining layer 1624 may be disposed over the planarization layer 1623. The pixel-defining layer 1624 may cover a part of the first electrode 1625. The pixel-defining layer 1624 may define an emission area of each sub-pixel by surrounding an edge of the first electrode 1625. The first electrode 1625 may be patterned in each sub-pixel. The pixel-defining layer 1624 may include an organic layer or an inorganic layer. The pixel-defining layer 1624 may have a single layer structure or a multiple layer structure.

The intermediate layer 1626 may be disposed over the first electrode 325. The intermediate layer 1626 may be disposed over an area in which the first electrode 1625 is exposed by etching a part of the pixel-defining layer 1624. The intermediate layer 1626 may include an organic emission layer.

According to a selective embodiment, the intermediate layer 1626 may include an emissive layer and may further include at least one of a hole injection layer (HIL), a hole transport layer (HTL), an electron transport layer (ETL), and an electron injection layer (EIL). However, the present invention is not limited thereto, and in other embodiments, the intermediate layer 1626 may include the emissive layer and may further include other various function layers.

The second electrode 1627 may be disposed over the intermediate layer 1626. The second electrode 1627 may function as a cathode. The second electrode 1627 may include a transparent electrode or a reflective electrode. When the second electrode 1627 is a transparent electrode, the second electrode 1627 may include a metal layer and a transparent conductive layer over the metal layer. When the second electrode 1627 is a reflective electrode, the second electrode 1627 may include the metal layer.

According to an embodiment, a plurality of sub-pixels may be arranged over the display substrate 1611. Each sub-pixel may be, for example, red, green, blue, or white. However, the present invention is not limited thereto.

The thin film encapsulation portion 1640 may protect the OLED from external moisture, oxygen, etc. The thin film encapsulation portion 1640 may include an inorganic layer 1641 and an organic layer 1642 that are alternately stacked. For example, the inorganic layer 1641 may include a first inorganic layer 1643, a second inorganic layer 1644, and a third inorganic layer 1645. The organic layer 1642 may include a first organic layer 1646 and a second organic layer 1647.

As described above, according to the one or more embodiments of the present invention, a display device may reduce light leakage in a non-active area.

It should be understood that example embodiments described herein should be considered in a descriptive sense and not for purposes of limitation. Descriptions of features or aspects within each embodiment should be considered as available for other similar features or aspects in other embodiments. While one or more embodiments have been described with reference to the figures, it will be understood by those of ordinary skill in the art that various changes in form and details may be made therein without departing from the spirit and scope of the present invention as defined by the following claims, and equivalents thereof.

What is claimed is:

1. A display device comprising:
   a display panel comprising a display substrate having an active area and a non-active area outside the active area and a thin film encapsulation layer covering the display substrate;
   a printing film on the display panel and comprising a base film, a printing layer on one surface of the base film, and a plurality of reflectors arranged in a reflective area of the base film corresponding to the non-active area;
   a cover window on the printing film; and
   an adhesive layer between the printing film and the cover window,
   wherein a refractive index of the reflective area is less than that of the adhesive layer.

2. The display device of claim 1, wherein the reflectors comprise a plurality of grooves extending into but not passing through the base film.

3. The display device of claim 2, wherein the reflectors correspond to the printing layer and extend in a direction perpendicular to the display substrate.

4. The display device of claim 3, wherein the reflective area covers the printing layer.

5. The display device of claim 4, wherein the printing layer surrounds the active area.

6. The display device of claim 2, wherein the adhesive layer covers the reflectors.

7. The display device of claim 2, wherein the reflectors are randomly distributed in the reflective area corresponding to the printing layer.

8. The display device of claim 2, wherein the reflectors are uniformly distributed in the reflective area corresponding to the printing layer.

9. The display device of claim 2, wherein a density of the reflectors gradually reduces in a direction away from the active area.

10. The display device of claim 2, wherein the grooves extend in a thickness direction of the base film.

11. The display device of claim 10, wherein the reflectors are filled with one or more materials having smaller refractive indices than that of the adhesive layer.

12. The display device of claim 1, wherein the reflectors comprise through-holes that pass through the base film.

13. The display device of claim 12, wherein the reflectors have the same size.

14. The display device of claim 13, wherein a diameter of the reflectors gradually reduces in a thickness direction of the base film.

15. The display device of claim 12, wherein the reflectors have different sizes.

16. The display device of claim 15, wherein a diameter of the reflectors gradually reduces in a thickness direction of the base film.

17. The display device of claim 12, wherein the reflectors are filled with one or more materials having smaller refractive indices than that of the adhesive layer.

18. The display device of claim 12, wherein the through-holes are unfilled.

19. The display device of claim 1, wherein the base film is one or more selected from polyimide (PI), polycarbonate (PC), polyethylene terephthalate (PET), polyethersulphone (PES), polyethylene naphthalate (PEN), polyarylate (PAR), and fiberglass reinforced plastic (FRP).

20. The display device of claim 1, wherein a diameter of the reflectors is in a range from about 1 nanometer to about 100 micrometers.

* * * * *